United States Patent [19]

Carruthers et al.

[11] Patent Number: 4,481,485

[45] Date of Patent: Nov. 6, 1984

[54] OPTICALLY TRIGGERED TRANSFERRED-ELECTRON DEVICE MICROWAVE BURST AND SINGLE PULSE GENERATORS

[75] Inventors: Thomas F. Carruthers, Laurel; Joseph F. Weller, Fort Washington, both of Md.; Henry F. Taylor, Alexandria, Va.

[73] Assignee: The United States of America as represented by the Secretary of the Navy, Washington, D.C.

[21] Appl. No.: 345,454

[22] Filed: Feb. 3, 1982

[51] Int. Cl.³ .................. H03B 9/12; H03B 17/00; H01L 31/02
[52] U.S. Cl. .................. 331/66; 331/107 G; 332/7.51; 357/3; 357/30
[58] Field of Search .................. 331/66, 104, 107 R, 331/107 G; 332/7.51; 357/3, 30; 455/609, 611, 615; 307/311

[56] References Cited

U.S. PATENT DOCUMENTS 3,800,246  3/1974  Bosch et al. ............ 331/107 G X
3,991,328  11/1976  Upadhyayula ........... 331/107 G X

OTHER PUBLICATIONS

Esposito, R. M. et al., "Oscillator" IBM Technical Disclosure Bulletin, v. 12, n. 11, p. 1755 (Apr. 70).
Kimura, T. et al., "Optical Triggering of Gunn-Effect Device" Electronics and Communications in Japan, v. 55-C, n. 10, pp. 86-92, (Oct. 72).
Carruthers, T. F. et al., "Oscillation Burst Generation in Transferred-Electron Devices With Picosecond Optical Pulses" Applied Physics Letters, v. 38 n. 4 pp. 202-204 (Feb. 15, 1981).
Carruthers, T. F. et al., "Transient Responses of Transferred-Electron Devices to Picosecond Optical Pulses" (Abstract) Bulletin of the American Physical Society, v. 22, n. 3, p. 457 (Mar. 81).
Carruthers, T. F. et al., "Measurement of Fluctuations Affecting Domain Formation in Transferred-Electron Logic Devices Using Picosecond Optical Pulses" Applied Physics Letters, v. 40, n. 2, pp. 150-152 (Jan. 15, 1982).

*Primary Examiner*—Eugene R. LaRoche
*Assistant Examiner*—W. R. Paxman
*Attorney, Agent, or Firm*—Robert F. Beers; William T. Ellis; John L. Forrest

[57] ABSTRACT

Transferred-electron device (TED) microwave burst and single pulse generators which are triggered by picosecond optical pulses. The burst generator includes a TED having a cathode, an anode, and a gate electrode positioned therebetween, all located on a semiconductor substrate. An optical pulse applied to the substrate between the gate and anode electrodes causes a plurality of space charge domains to sequentially travel from the gate to the illuminated region thereby causing an oscillatory burst of current to occur in the external leads of the TED. The frequency of the burst is proportional to the distance between the gate and the illuminated region and the burst duration is proportional to the optical pulse amplitude and/or duration. Alternatively, the burst generators may be formed from a two terminal TED with the cathode electrode being treated as the gate. A single pulse generator may be formed by applying an optical pulse to the substrate between the cathode and the gate of a three terminal TED. The duration of the single pulse is proportional to the distance between the gate and the anode.

14 Claims, 15 Drawing Figures

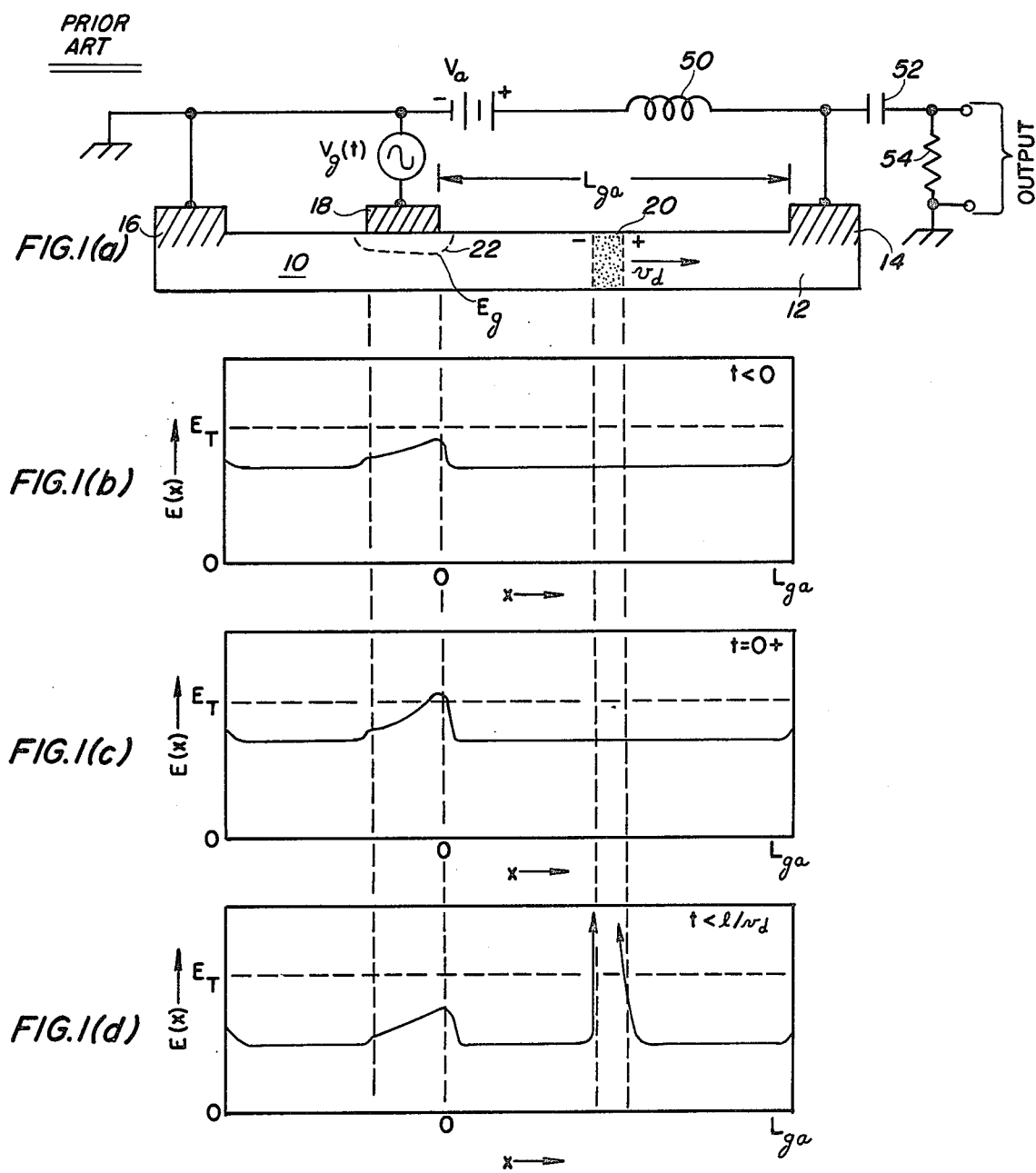

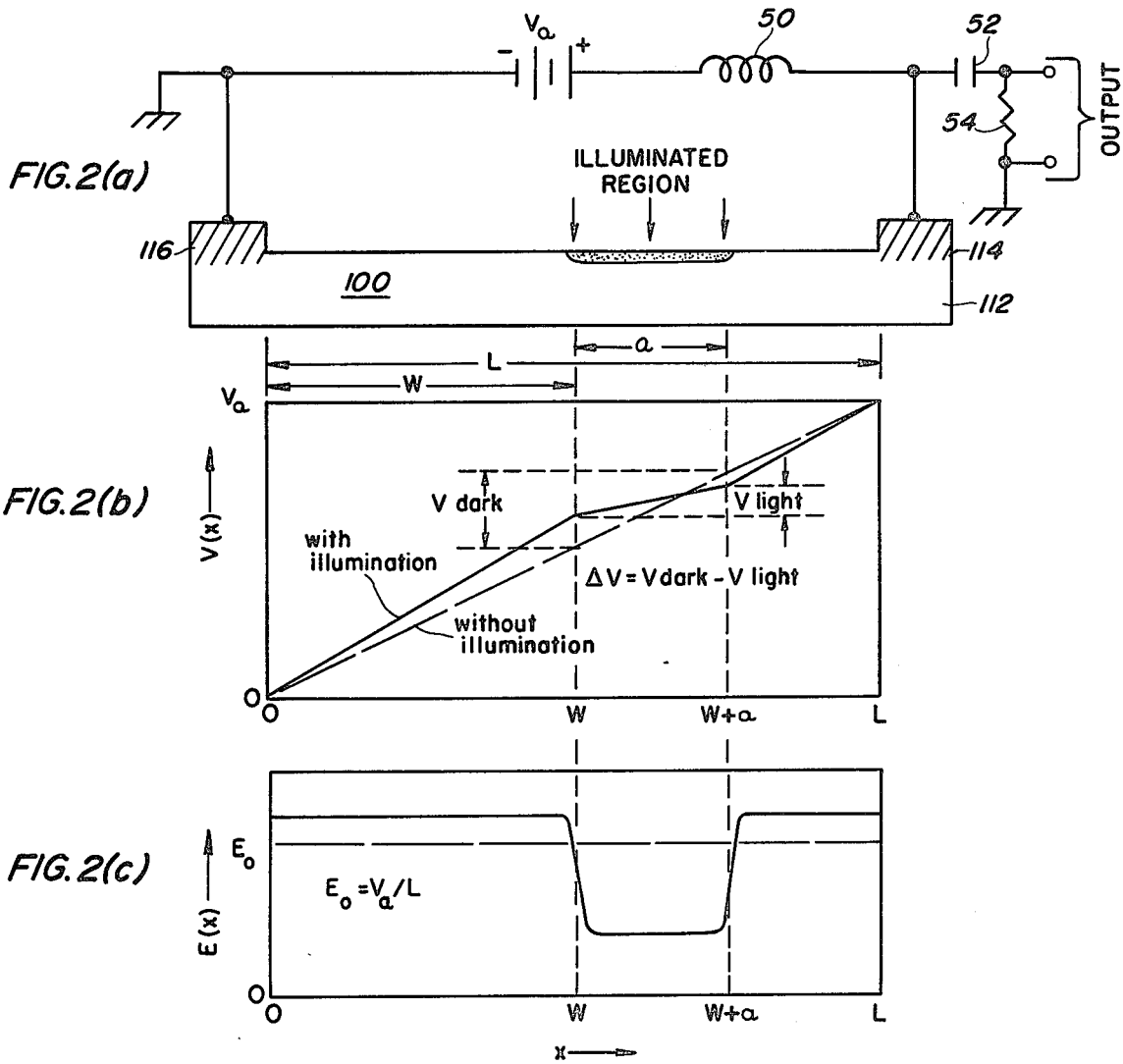
FIG.2(a)
FIG.2(b)
FIG.2(c)
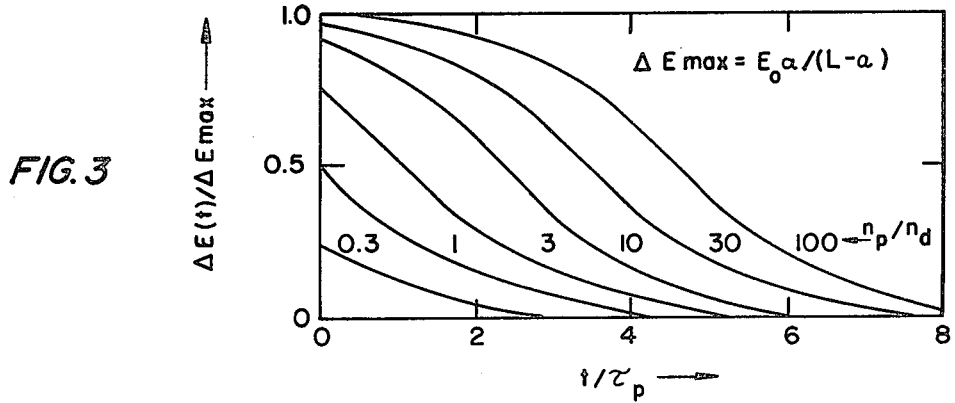
FIG.3

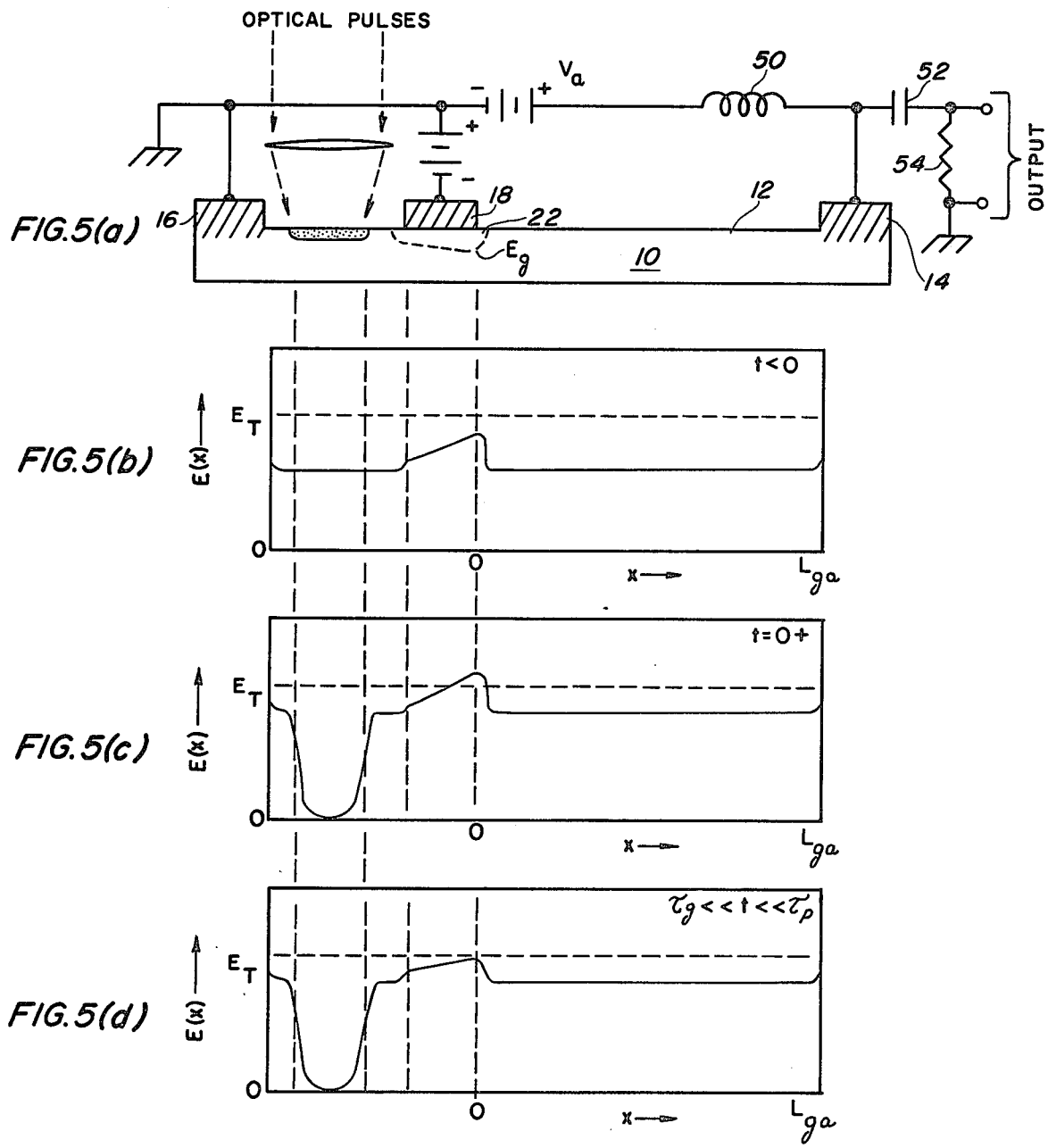

OPTICALLY TRIGGERED TRANSFERRED-ELECTRON DEVICE MICROWAVE BURST AND SINGLE PULSE GENERATORS

BACKGROUND OF THE INVENTION

1. Field of the Invention

The present invention relates to novel transferred electron device microwave burst and pulse generator devices which are triggered by optical pulses having durations on the order of a picosecond.

2. Description of the Prior Art

When certain direct gap semiconductor materials such as Gallium Arsenide (GaAs) and Indium Phosphide (InP) are subjected to sufficiently high electric fields, the velocity of the charge carriers decreases with a further increase in field strength (negative differential conductivity). The critical value for the electric field strength $E_T$ required to produce this phenomenon is a characterisistic of the particular semiconductor material. For example, the critical value for Gallium Arsenide is approximately 3.5 kV/cm.

In suitably configured two terminal devices, this negative differential conductivity under critical field strength conditions leads to the formation of a localized space-charge domain at the negatively-biased end of the device which propagates toward the positively-biased end of the device at a characteristic velocity $V_d$ which is approximately $10^7$ cm/sec for most materials. The presence of a domain is signaled by a drop in the current flowing through the device. When the domain reaches the positive end of the device, the current rises until a new domain forms which subsequently propagates through the device resulting in another drop in current. Thus, an oscillator device can be formed which oscillates at a frequency $f_o$ equal to the characteristic velocity $V_d$ divided by the propagation length of the device. Such devices are known as transferred electron devices (TED) or Gunn effect devices.

Typical propagation lengths for microwave integrated circuit TED's range from five to several hundred microns, and oscillation frequencies therefore extend from several hundred megahertz to over twenty gigahertz. Specially constructed devices can oscillate at frequencies beyond 100 GHz.

A TED to which control electrodes, in addition to the anode and cathode electrodes, are attached is known as a transferred-electron logic device (TELD). FIG. 1(a) illustrates a TELD 10 which includes a semiconductor substrate 12, an anode region 14, a cathode region 16, and a Schottky-barrier gate electrode 18. A depletion layer 22, under the gate electrode 18 is swept free of carriers by a built-in field and therefore constricts the volume of semiconductor material available for current flow. Thus, the electric field located under the gate electrode 18 is higher than elsewhere within the TELD 10 as shown in FIGS. 1(b) through 1(d). The maximum value of the electric field $E_g$ is located under the edge of the gate electrode 18 which is closest to the anode region 14 as shown in these Figures. The position of the maximum electric field $E_g$ is the domain nucleation site: i.e., the site at which domains form. The thickness of the depletion layer 22, and thus the magnitude of the electric field, can be changed by applying and/or changing a control voltage $V_g$ applied to the gate 18. The device can therefore be biased below the critical electric field $E_T$ with a fixed bias voltage $V_a$ as shown in FIGS. 1(a) and 1(b) and can be triggered into operation with a negative voltage pulse $V_g(t)$ applied to the gate as shown in FIGS. 1(a), 1(c), and 1(d).

In most devices of this type, only one domain, such as domain 20 in FIG. 1(a), is present at a time and a new domain is formed after an existing domain is annihilated at the anode. If the gate is held at a sufficiently negative potential, the device will oscillate at a fixed frequency $f_o = V_d/L_{ga}$ (as detected across the load resister 54) where $V_d$ is the characteristic velocity and $L_{ga}$ is the gate to anode distance. If a sufficiently short voltage pulse is applied to the gate in place of a constant voltage, a single domain of duration $T_o = 1/f_o$ will result.

It is known in the art that a single domain or a pair of domains may be formed in a two-terminal TED, biased slightly below the critical field level $E_T$ which is subjected to illumination between the cathode and anode electrodes. For example, Adams and Schulte (Applied Physics Letters, Vol. 15, No. 8, Oct. 15, 1969) determined that the application of a 1 nanosecond optical pulse to such a device will trigger the formation of a single domain having a transit time proportional to the distance between the cathode and the point of illumination. Other experimenters have observed a pair of domains under similar conditions.

In each of the prior art TED and TELD devices described above thermal carrier density fluctuations produce a randomly fluctuating electric field noise component $E_n$ which limits the speed of response of these devices. Also, in voltage triggered devices, the gate voltage pulses have a risetime limited to the order of 100 picoseconds or more by the bandwidth of the associated circuitry (the pulse source plus transmission lines). The resulting finite rise time of the gate electric field $dE_g/dt$ and the field noise $E_n$ together result in an uncertainty in the time $\Delta t_n$ at which $E_g$ rises above $E_T$, given by:

$$\Delta t_n \cong E_n/(dE_g/dt)$$
$$= E_n/\{(dV_g/dt)\,[(\partial E_g)/\partial V_g]\,E_T\}$$

This uncertainty in the triggering time is known as "fm noise". For typical microwave integrated circuit TELD's $\Delta t_n$ lies in the range of 40 to 100 picoseconds.

The present invention relates to novel transferred-electron device oscillators which are triggered by optical pulses having durations on the order of a picosecond. Optical pulses of picosecond duration can trigger such devices much more quickly than voltage pulses, with a drastic reduction in fm noise as a result. Bursts of oscillations of independently controllable duration and frequency may be generated without complicated electronic circuitry and single current pulses, useful in logic applications, may also be produced with picosecond time synchronization.

Picosecond optical pulses may be obtained from a variety of sources. For example, synchronously mode-locked linear or ring dye lasers generate extremely short pulses; however, these devices are physically large. Solid state lasers with external cavity mirrors are a more compact source. Some solid-state lasers without external resonators exhibit "self-pulsing" and are another potential source. Light-emitting diodes and solid-state lasers may also be electronically driven to produce picosecond pulses.

SUMMARY OF THE INVENTION

Accordingly, one object of the present invention is to provide novel microwave burst and pulse generators wherein the effects of fm noise are drastically reduced.

Another object is to provide novel transferred-electron device oscillation generators which are capable of providing bursts of oscillations.

Still another object is to provide a novel transferred-electron device generator of very high frequency microwave bursts and single pulses.

These and other objectives are achieved through novel transferred-electron devices which are triggered by picosecond optical pulses. Picosecond optical pulses applied between the cathode and the anode of a two terminal TED and between the gate and anode of a three terminal TELD act to produce a plurality of interruptions in the bias current flowing through these devices thereby resulting in a burst of oscillations. Picosecond optical pulses applied between the cathode and the gate of a TELD result in a single interruption in the bias current thereby producing a single output pulse.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1(a) is a cross-sectional view of a prior art Schottky-barrier gated transferred-electron logic device (TELD);

FIG. 1(b) is a plot of the electric field E(x) as a function of device length x for the device shown in FIG. 1(a) when the device is biased below the threshold level $E_T$;

FIG. 1(c) is a plot of the electric field E(x) as a function of device length x for the device shown in FIG. 1(a) immediately after a negative voltage pulse has been applied to the gate electrode;

FIG. 1(d) is a plot of the electric field E(x) as a function of device length x for the device shown in FIG. 1(a) illustrating the field distribution with a domain in transit;

FIG. 2(a) is a cross-sectional view of a transferred-electron device (TED) which includes an illuminated region according to the present invention;

FIG. 2(b) is a plot of the potential V(x) as a function of device length x illustrating the potential distribution for the device shown in FIG. 2(a);

FIG. 2(c) is a plot of the electric field E(x) as a function of device length x illustrating the electric field distribution for the device shown in FIG. 2(a);

FIG. 3 is a plot of the change in electric field $\Delta E(t)$ in the non-illuminated region normalized to the maximum field change $\Delta E_{max}$ as a function of time t normalized to the photocarrier lifetime $\tau_p$ for various ratios of the initial photogenerated carrier density $n_p$ to the semiconductor doping density $n_d$ for the device shown in FIG. 2(a);

FIG. 5(a) is a cross-sectional view of a Schottky-barrier gated transferred-electron logic device (TELD) with illumination between the cathode and gate according to a preferred embodiment of the present invention;

FIG. 5(b) is a plot of the electric field E(x) as a function of device length x illustrating the electric field distribution for the device illustrated in FIG. 5(a) immdiately before illumination;

FIG. 5(c) is a plot of the electric field E(x) as a function of device length x illustrating the electric field distribution for the device illustrated in FIG. 5(a) immediately after illumination; and FIG. 5(d) is a plot of the electric field E(x) as a function of device length x illustrating the electric field distribution for the device illustrated in FIG. 5(a) at a time much greater than the gate relaxation time $\tau_g$ but much less than the excess carrier lifetime $\tau_p$.

DESCRIPTION OF THE PREFERRED EMBODIMENTS

Figure 4A:
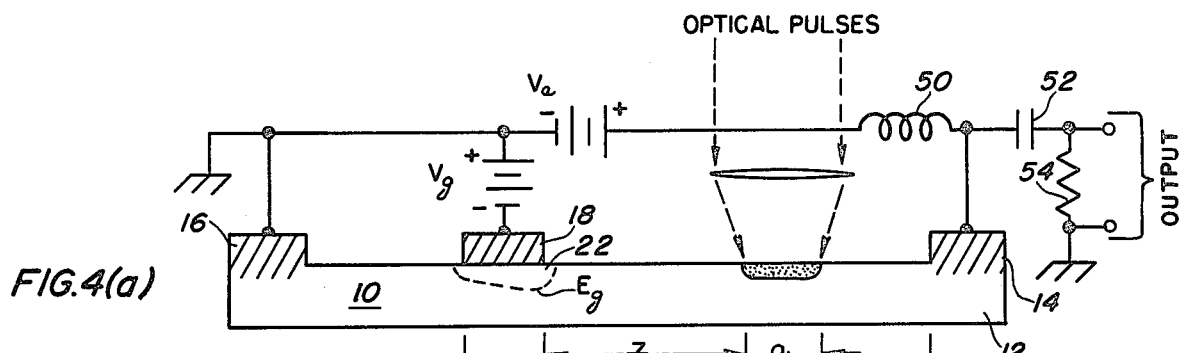
FIG. 4(a) is a cross sectional view of a Schottky-barrier gated transferred-electron logic device (TELD) with illumination between the anode and gate according to a preferred embodiment of the present invention.

Referring now to the drawings, wherein like reference numerals designate identical or corresponding parts throughout the several views, and more particularly to FIG. 2(a) thereof, a transferred-electron device (TED) 100 according to a first preferred embodiment of the present invention is illustrated as including a semiconductor substrate 112, a cathode region 116, and an anode region 114. The substrate 112 may be made of any semiconducting material which exhibits negative differential conductivity and the device 100 may be constructed by methods well known in the art. By way of example, a typical planar TED structure may be formed by epitaxially growing a 0.5 to 5 micron GaAs active layer having a length ranging between 20 and 100 microns and a width ranging between 5 and 100 microns on a semi-insulating substrate with a high-resistivity buffer layer located therebetween. A typical active layer donor density $n_d$ may be approximately $3 \times 10^{16}/cm^3$. Other equivalent structures could be utilized as should be apparent to those skilled in the art.

The Inventors of the present invention have discovered that the application of optical pulses to the substrate of a TED results in a decrease in the electric field in the illuminated region and a corresponding increase in the electric field in the non-illuminated portions of the substrate. Thus, in FIG. 2(a), a voltage $V_a$ applied across the length L of the substrate 112 produces a potential distribution as shown by the dashed line in FIG. 2(b) and produces a uniform electric field $E_o = V_a/L$ as illustrated by the broken line in FIG. 2(c).

An optical pulse whose photon energy is greater than the band-gap energy of the semiconductor substrate 112 creates charge carriers which increase the conductivity of the illuminated region. Illumination of a length "a" of the substrate 112 decreases the voltage drop across the illuminated region "a" by an amount $\Delta V$, as illustrated by the solid line in FIG. 2(b), and decreases the electric field in the region "a" by an amount approximately proportional to the change in conductivity. The field in the non-illuminated region correspondingly increases in compensation as illustrated by the solid line in FIG. 2(c). Thus, without illumination, the field is a uniform value $E_o=V_a/L$. Due to illumination the electric field inside the illuminated region is depressed by an amount $\Delta V/a$, and the field outside is increased by an amount $\Delta V/(L-a)$. Since the maximum field change inside the illuminated region is from $E_o$ to zero, the maximum field change in the non-illuminated parts is $\Delta E_{max}=aE_o/(L-a)$.

The carriers generated by the optical pulse decay exponentially with time with a characteristic lifetime $\tau_p$, and the optically-induced changes in the fields will endure for the order of this lifetime. FIG. 3 is a plot of the time dependence of the field increase outside the illuminated region at several different incident optical pulse intensities. The field change $\Delta E(t)$ has been normalized to the maximum field change $\Delta E_{max}$. The initial photogenerated carrier density $n_p$ is proportional to the optical intensity. In FIG. 3, $n_p$ has been normalized to the background doping density $n_d$ of the semiconductor and the time scale has been normalized to the photocarrier lifetime $\tau_p$. $\tau_p$ is typically on the order of a nanosecond, but fabrication techniques can produce lifetimes much greater or much less than this value. The field increase endures for a period of time proportional to the logarithm of the intensity of the incident optical pulse.

The Inventors of the present invention have discovered that the application of very short optical pulses having durations on the order of a picosecond to a TED results in the production of a burst of oscillations. In order to produce a burst of oscillations, the bias potential Va is set so that the electric field within the semiconductor substrate 112 is below the critical field level $E_T$. An optical pulse of picosecond duration and of sufficient intensity to raise the field level in the non illuminated portions of the device above the critical level will result in domain formation of the vicinity of the cathode 116 and will result in subsequent domain propagation in the substrate as detected by the current flowing through the load resistor 54.

Frequency control is a consequence of the fact that a domain incident upon a region where the electric field is lower than a sustaining value $E_s$ (=1.5 kV/cm for GaAs) will be annihilated. In a standard TED this occurs only at the anode and the device oscillates at the fixed frequency $f_o=V_d/L$, as has been described above with regard to the prior art. Under the conditions shown in FIG. 2(a), however, domains will be extinguished after traversing the distance W, since the electric field drops to a low value in the illuminated area. The oscillation frequency therefore depends on the distance between the cathode and the illuminated region as $f(W)=V_d/W$, and the frequency may be changed by changing this distance. Domains will continue to form and propagate, and thus the burst of oscillations will continue until the maximum field level decays below the critical field level as shown by FIG. 3.

For burst oscillation to occur, it is necessary that the optical pulse duration be much less than the photocarrier lifetime ($\tau_p$) of the semiconductor material. In the present embodiment pulses ranging between 1 and 3 picoseconds produce satisfactory results.

Figure 4B:
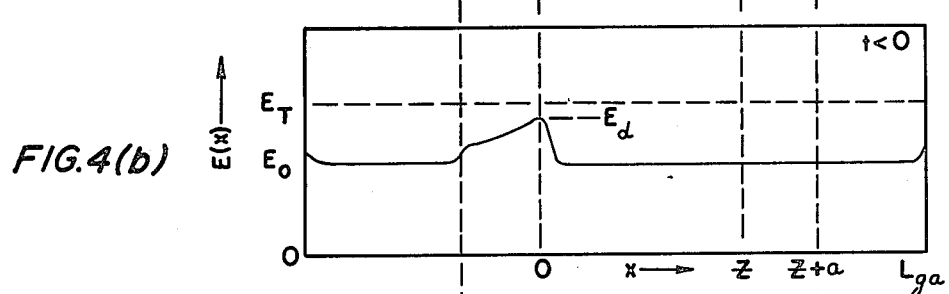
FIG. 4(b) is a plot of the electric field E(x) as a function of device length x illustrating the electric field distribution for the device illustrated in FIG. 4(a) immediately before illumination.
Figure 4C:
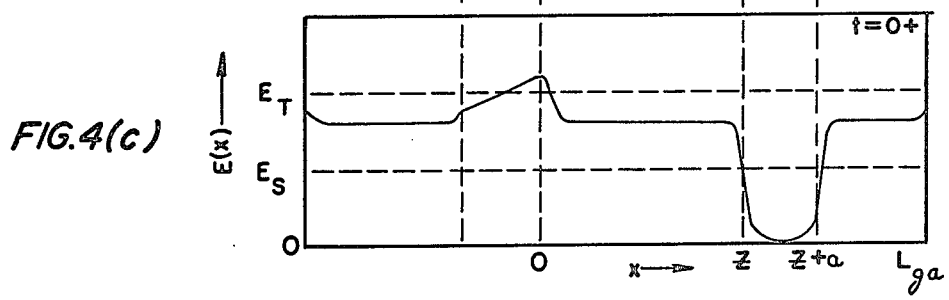
FIG. 4(c) is a plot of the electric field E(x) as a function of device length x illustrating the electric field distribution in the device illustrated in FIG. 4(a) immediately after illumination.

FIG. 4(a) illustrates a burst oscillator according to a second preferred embodiment of the present invention which includes a TELD structurally similar to the prior art TELD shown in FIG. 1(a). In this embodiment, the anode 14 and the gate 18 are biased with respect to the cathode 16 such that the electric field within the substrate 12 is below the critical field level $E_T$ as shown in FIG. 4(b). Upon illumination of length "a" of the substrate 12 by an optical pulse of sufficient intensity and having a duration much less than the photocarrier lifetime $\tau_p$ of the semiconductor material, the electric field beneath the gate is increased above the critical level $E_T$, while the field between lengths z and z+a is reduced below the sustaining level $E_s$. Under these conditions, a burst of oscillations occurs for a time period as described above with respect to FIG. 3 and at a frequency $f_o=V_d/z$. The frequency thus may be changed by changing the distance z while the burst time may be changed by altering the intensity and duration characteristics of the optical pulse. For example, optical pulses having a duration of between 1 and 3 picoseconds produce satisfactory results.

The oscillation burst generators described hereinabove are extremely simple devices which produce complex microwave signals useful, among other applications, in radar ranging. The burst duration may be rapidly varied by amplitude modulation of the optical pulses. The frequency may be varied, either between bursts or within a burst, by changing the distance between the cathode and the optical spot (FIG. 2(a)) or between the gate and optical spot (FIG. 4(a)). This may be accomplished among other means, by moving the spot across the TED with scanning mirrors or acoustooptic elements or by fixing the optical beam and moving the TED with a piezoelectric drive. Obviously other common means are possible as is apparent to those skilled in the art.

Single domains or isolated current pulses of duration $L_{ga}/V_d$ can be generated by illuminating the semiconductor region between the cathode and gate of a Schottky-barrier gated TELD as shown in FIG. 5(a) which illustrates a third preferred embodiment of the subject invention. FIGS. 5(b), 5(c), and 5(d) respectively illustrate the electric field conditions in the semicondutor substrate 12 just before illumination, just after illumination, and at a time much greater than the gate relaxation time $\tau_g$ but much less than the excess carrier lifetime $\tau_p$.

Although illumination by an optical pulse increases the field beneath the gate 18 to a level above the critical field level in the same manner as described above for gate to anode illumination (FIG. 4(a)), oscillation burst generation is not observed under these conditions. Although the exact mechanism is not presently fully understood. the inventors of the present invention believe that multiple domain generation (burst generation) is most likely inhibited due to the fast relaxation time (typically on the order of 10 to 20 picoseconds) of the depletion layer 22 in response to the decreased cathode to gate potential, which lowers the gate field $E_g$ to below the critical field level $E_T$ before the first domain has completed its transit. Thus only single pulses are generated In the single pulse embodiment, it is important that the input optical pulse duration be less than the relaxation time. Durations of 1 to 3 picoseconds have been observed to produce good results.

The picosecond time precision of the single domain generator described hereinabove enhances its usefulness as a logic element in high-speed digital processing applications. Time synchronization of several of these devices may be achieved by driving them from the same optical source. The usefulness of TED's in logic operations is due to the fact that, with multiple gating, a single device can perform complicated operations. Optical triggering provides another means for data input and can be combined with electrical triggering to enhance the versatility of the devices.

Each of the devices disclosed hereinabove may be constructed of any semiconductor material which exhibits negative differential conductivity. Additionally, optical triggering may be used with practically any existing TED device.

The greatly decreased fm noise of these optically triggered devices is a major advance in both the oscillation burst and single pulse modes of operation. The optical trigger source may be any one which provides the desired pulse duration and amplitude. Since solid-state devices can generate picosecond optical pulses, the optically triggered TED systems can be physically compact. For example, TED's may be triggered with semiconductor optical switches which may be part of the circuitry on the TED substrate but not part of the TED itself.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A microwave burst generator device comprising:
   a substrate of negative differential conductivity semiconductor material, said substrate exhibiting negative differential conductivity characteristics when subjected to an electric field of at least a critical level;
   at least two electrode means contacting said substrate and located in a spaced relationship to each other for electrically coupling to said substrate;
   potential biasing means coupled to said at least two electrode means for biasing said at least two electrode means with respect to each other, for producing a flow of current in said substrate between said at least two electrodes, and for creating an electric field within said substrate, the maximum value of said field being less than the critical field level of said substrate; and
   optical pulse means for supplying at least one optical pulse to said substrate between two of said at least two electrode means, said at least one optical pulse having a duration which is much less than the photocarrier lifetime of said substrate, said at least one optical pulse having a duration on the order of a picosecond, said at least one optical pulse increasing the electric field in at least a portion of said substrate to a level which exceeds said critical field level resulting in the formation and propagation of space-charge domains in said substrate;
   wherein the current flowing between said two of said at least two electrode means is periodically interrupted a plurality of times due to said space-charge domain propagation in said substrate thereby producing a burst of microwave oscillations.

2. The microwave burst generator device as recited in claim 1, wherein:
   said optical pulse means includes means for controlling the distance between the most negatively biased electrode means of said two of said at least two electrode means and the point of incidence of said at least one optical pulse, the frequency of said microwave oscillations being proportional to said distance.

3. The microwave burst generator device as recited in claim 1, wherein:
   said at least two electrode means include a cathode electrode means, an anode electrode means, and a gate electrode means located therebetween;
   said at least one optical pulse is supplied to said substrate between said gate and anode electrode means; and
   said periodically interrupted current flows between said gate and said anode electrode means.

4. The microwave burst generator device as recited in claim 1, wherein:
   said at least two electrode means include a cathode electrode means and an anode electrode means.

5. The microwave burst generator device as recited in claim 4, wherein:
   said optical pulse means includes means for controlling the distance between said cathode electrode means and the point of incidence of said at least one optical pulse, the frequency of said microwave oscillations being proportional to said distance.

6. A microwave burst generator device comprising:
   a substrate of negative differential conductivity material, said substrate exhibiting negative differential conductivity characteristics when subjected to an electric field of a least a critical level;
   gate, cathode, and anode electrode means contacting said substrate and located in a spaced relationship to each other for electrically coupling to said substrate, said gate electrode means being located between said anode and cathode electrode means;
   potential biasing means coupled to said gate, cathode, and anode electrode means for biasing said gate, cathode, and anode electrode means with respect to each other and for creating an electric field within said substrate, the maximum value of said field being less than the critical field level of said substrate, said potential biasing means producing a flow of current between said gate and anode electrode means; and
   optical pulse means for supplying at least one optical pulse to said substrate between said gate and said anode electrode means, said at least one optical pulse having a duration which is much less than the photocarrier lifetime of said substrate, said at least one optical pulse increasing the electric field in at least a portion of said substrate to a level which exceeds said critical field level resulting in the formation and propagation of space-charge domains in said substrate;
   wherein the current flowing between said gate and anode electrode means is interrupted a plurality of times due to said space-charge domain propagation in said substrate thereby producing a burst of microwave oscillations.

7. The microwave burst generator device as recited in claims 1, 2, 3, 4, 5, or 6, wherein:
   said optical pulse means includes means for controlling the duration of said at least one optical pulse such that said duration lies in the range of 1 to 3 picoseconds.

8. The microwave burst generator device as recited in claims 1, 3, 4, or 6, wherein:
   said optical pulse means includes means for controlling the duration of said burst of microwave oscillations by varying the amplitude of said at least one optical pulse.

9. The microwave burst generator device as recited in claim 3 or 6, wherein:
said optical pulse means includes means for controlling the distance between said gate electrode means and the point of incidence of said at least one optical pulse, the frequency of said microwave oscillations being proportional to said distance.

10. A microwave pulse generator device comprising:
a substrate of negative differential conductivity material, said substrate exhibiting negative differential conductivity characteristics when subjected to an electric field of at least a critical level;
gate, cathode, and anode electrode means contacting said substrate and located in a spaced relationship to each other for electrically coupling to said substrate, said gate electrode means being located between said anode and said cathode electrode means, a depletion layer being formed in a portion of said substrate beneath said gate electrode means;
potential biasing means coupled to said gate, cathode, and anode electrode means for biasing said gate, cathode, and anode electrode means with respect to each other and for creating an electric field within said substrate, the maximum value of said field being less than the critical field level of said substrate, said potential biasing means producing a flow of current between said gate and said anode electrode means; and
optical pulse means for supplying at least one optical pulse to said substrate between said cathode and said gate electrode means, said at least one optical pulse having a duration which is less than the relaxation time of said depletion layer; said at least one optical pulse increasing the electric field in at least a portion of said substrate to a level which exceeds said critical field level;
wherein the current flowing between said gate and said anode electrode means is interrupted shortly after the occurrence of each said at least one optical pulse thereby producing a single microwave pulse.

11. The microwave pulse generator device as recited in claim 10, wherein:
said optical pulse means includes means for controlling the duration of said at least one optical pulse such that said duration lies in the range of 1 to 3 picoseconds.

12. A method for generating a burst of microwave oscillations comprising the steps of:
providing a semiconductor device including a substrate of negative differential conductivity semiconductor material, said substrate exhibiting negative differential conductivity characteristics when subjected to an electric field of at least a critical level, said device further including at least two electrode means contacting said substrate and located in a spaced relationship to each other for electrically coupling to said substrate, and potential biasing means coupled to said at least two electrode means for biasing said at least two electrode means with respect to each other and for creating an electric field within said substrate, the maximum value of said field being less than the critical field level of said substrate, said potential biasing means producing a flow of current in said substrate between said at least two electrode means; and
supplying at least one optical pulse to said substrate between two of said at least two electrode means, said at least one optical pulse having a duration which is much less than the photocarrier lifetime of said substrate, said at least one optical pulse having a duration on the order to a picosecond, said at least one optical pulse increasing the electric field in at least a portion of said substrate to a level which exceeds said critical field level resulting in the formation and propagation of space-charge domains in said substrate;
wherein the current flowing between said two of said at least two electrode means is periodically interrupted a plurality of times due to said space-charge propagation in said substrate thereby producing a burst of microwave oscillations.

13. A method for generating a burst of microwave oscillations comprising the steps of:
providing a semiconductor device including a substrate of negative differential conductivity material, said substrate exhibiting negative differential conductivity characteristics when subjected to an electrical field of at least a critical leval; said device further including gate, cathode, and anode electrode means contacting said substrate and located in a spaced relationship to each other for electrically coupling to said substrate, said gate electrode means being located between said anode and cathode electrode means; and potential biasing means coupled to said gate, cathode, and anode electrode means for biasing said gate, cathode, and anode electrode means with respect to each other and for creating an electric field within said substrate, the maximum value of said field being less than the critical field level of said substrate, said potential biasing means producing a flow of current between said gate and anode electrode means; and
supplying at least one optical pulse to said substrate between said gate and said anode electrode means, said at least one optical pulse having a duration which is much less than the photocarrier lifetime of said substrate, said at least one optical pulse increasing the electric field in at least a portion of said substrate to a level which exceeds said critical field level resulting in the formation and propagation of space-charge domains in said substrate;
wherein the current flowing between said gate and anode electrode means is interrupted a plurality of times due to said space-charge domain propagation in said substrate thereby producing a burst of microwave oscillations.

14. A method for generating a microwave pulse comprising the steps of:
providing a substrate of negative differential conductivity material, said substrate exhibiting negative differential conductivity characteristics when subjected to an electric field of at least a critical level;
gate, cathode, and anode electrode means contacting said substrate and located in a spaced relationship to each other for electrically coupling to said substrate, said gate electrode means being located between said anode and said cathode electrode means, a depletion layer being formed in a portion of said substrate beneath said gate electrode means; and potential biasing means coupled to said gate, cathode and anode electrode means for biasing said gate, cathode, and anode electrode means with respect to each other and for creating an electric field within said substrate, the maximum value of said field being less than the critical field level of said substrate, said potential biasing means producing a flow of current between said gate and said anode eleotrode means; and supplying at least one optical pulse to said substrate between said cathode and said gate electrode means, said at least one optical pulse having a duration which is less than the relaxation time of said depletion layer, said at least one optical pulse increasing the electric field in at least a portion of said substrate to a level which exceeds said critical field level;

wherein the current flowing between said gate and said anode electrode means is interrupted shortly after the occurrence of each said at least one optical pulse thereby producing a single microwave pulse.

* * * * *